(12) United States Patent
Mou et al.

(10) Patent No.: US 7,053,472 B2
(45) Date of Patent: May 30, 2006

(54) OPTICAL PACKAGE STRUCTURE

(75) Inventors: Chung-Shin Mou, Tu-Chen (TW);
Nan-Tsung Huang, Tu-Chen (TW);
Young-Tarng Lin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 312 days.

(21) Appl. No.: 10/308,466

(22) Filed: Dec. 2, 2002

(65) Prior Publication Data
US 2003/0234403 A1    Dec. 25, 2003

(30) Foreign Application Priority Data
Jun. 20, 2002    (TW) .............................. 91113537 A

(51) Int. Cl.
*H01L 21/00*    (2006.01)
(52) U.S. Cl. .................... 257/680; 257/100; 385/93
(58) Field of Classification Search ................ 257/680, 257/100, 80–82, 98–99; 385/93
See application file for complete search history.

(56) References Cited
U.S. PATENT DOCUMENTS

| | | | |
|---|---|---|---|
| 5,815,623 A * | 9/1998 | Gilliland et al. ............. 385/93 |
| 5,896,481 A * | 4/1999 | Beranek et al. .............. 385/90 |
| 5,950,074 A * | 9/1999 | Glenn et al. ................. 438/121 |
| 6,071,017 A * | 6/2000 | Gilliland et al. ............. 385/93 |
| 6,283,644 B1 * | 9/2001 | Gilliland et al. ............. 385/93 |
| 6,416,238 B1 * | 7/2002 | Gilliland et al. ............. 385/88 |
| 6,550,983 B1 * | 4/2003 | Gilliland et al. ............. 385/93 |
| 6,787,890 B1 * | 9/2004 | Huang et al. ............... 257/680 |

* cited by examiner

*Primary Examiner*—Laura M. Schillinger
(74) *Attorney, Agent, or Firm*—Wei Te Chung

(57) ABSTRACT

An optical package structure (2) includes a cover (21) defining an aperture (212) in a top portion for transmission of optical signals, a lens part (22) secured to the cover, and a base member (23) combining with the cover to define a closed space in which to package optical components. A plurality of solder pads (2311–2314, 2391–2394, 2391', 2392') is provided on both a top and a bottom surfaces (2321, 2342) of the base member, and a plurality of inner conductive traces (236, 239) extends through the base member and provides an electrical connection of the solder pads on the top surface to the solder pads on the bottom surface. All the solder pads on the top surface are connected to a complementary solder pad located along a first side edge of the bottom surface, and at least one of the solder pads on the top surface is electrically connected to one of the solder pads on the bottom surface which is not located along the first side edge.

6 Claims, 7 Drawing Sheets

OPTICAL PACKAGE STRUCTURE

BACKGROUND OF THE INVENTION

This application is related to our co-pending application Ser. No. 10/198,976, filed Jul. 18, 2002.

FIELD OF THE INVENTION

The present invention generally relates to optical packages, and particularly to optical package structures adapted for high density packaging and high frequency transmission.

RELATED ART

Optoelectronic components generally require a package structure to protect them from damage and from EMI (Electro Magnetic Interference). Without such protection, damage can result from exposure to moisture, dirt, heat, radiation, or other hazards. In addition, a special structure is desired to electrically connect active components in a package with outer circuitry or other components if the active components need to be electrically connected therewith.

A traditional package structure, as shown in FIG. 7, is disclosed in U.S. Pat. No. 5,812,582. The package structure 1 includes a header assembly 17 with a base 10, and a cover assembly 18 having a cover 12 and a lens 13. The two assemblies 17 and 18 are assembled together to define a closed space to receive and protect laser components 16. The laser components 16 are mounted on a surface 101 of the base 10, and a plurality of electrical pins 11 extends through the base 10 via corresponding passages 19. The electrical pins 11 are electrically isolated from the base 10 by corresponding glass seals 15. The laser components 16 are electrically connected with the corresponding electrical pins 11 by wires 14. Thus, an external electrical connection of the laser components 16 is formed.

The above-mentioned package structure can satisfy a general need for packaging. However, the external electrical connection of the laser components 16 is formed by the electrical pins 11 and wires 14, and the electrical pins 11 and wires 14 are long enough to produce capacitance and inductance effects strong enough to influence the working character of optical components during high frequency transmission. In addition, in high-density packaging, inner components need more electrical pins and wires to electrically connect with outer components, so the packaging volume becomes larger and short circuits become more frequent. Moreover, when such a package structure is assembled on a printed circuit board (PCB), there is only one way to engage the package with the PCB, with the vertical axis perpendicular to the plane of the PGB. In some situations, a more flexible arrangement will save more PCB space.

Therefore, an improved optical package structure that overcomes the above-mentioned disadvantages is desired.

SUMMARY OF THE INVENTION

An object of the present invention is to provide an optical package structure adapted for high density packaging and high frequency transmission.

Another object of the present invention is to provide an optical package structure which can be mounted to a printed circuit board (PCB) in more than one way, one of such ways allowing more space to be saved on the PCB to receive other elements.

To achieve the above objects, an optical package structure includes a cover with a lens part, and a base member attachable to the cover, which together define a closed space in which to package optical components. The base member has a bottom panel to which the optical components are mounted, and a substrate. The bottom panel has a first surface with a plurality of solder pads thereon, and a plurality of inner conductive traces extending therethrough and electrically connecting with the solder pads. The solder pads electrically connect with the optical components. The substrate has a top surface with printed circuits thereon, a bottom surface with a plurality of solder pads thereon, and a plurality of inner conductive traces extending through the substrate and electrically connecting the printed circuits to the solder pads. When the bottom panel is assembled to the substrate, the conductive traces of the bottom panel electrically connect with the printed circuits, so the solder pads of the bottom panel electrically connect with the solder pads of the substrate. Thus, an external electrical connection of the optical components is attained without wires and electrical pins.

In one example of the present invention, the substrate is square in shape and has six solder pads on its bottom surface, two at the corners of a first side and four on an opposite second side, with the two solder pads on the first side being electrically connected with two solder pads on the second side via the printed circuits and inner conductive traces. When the package structure is assembled to a PCB, the package structure can be engaged with the PCB in either of two ways. In a first way, the package structure is engaged with the PCB with the bottom surface of the substrate parallel with the plane of the PCB. In a second way, an edge of the second side of the substrate is attached to the plane of the PCB, with the four solder pads electrically connecting to circuitry of the PCB.

These and additional objects, features and advantages of the present invention will become more apparent after reading the following detailed description of a preferred embodiment of the invention when taken in conjunction with the appended drawings, in which:

DETAILED DESCRIPTION OF THE INVENTION

Figure 1:
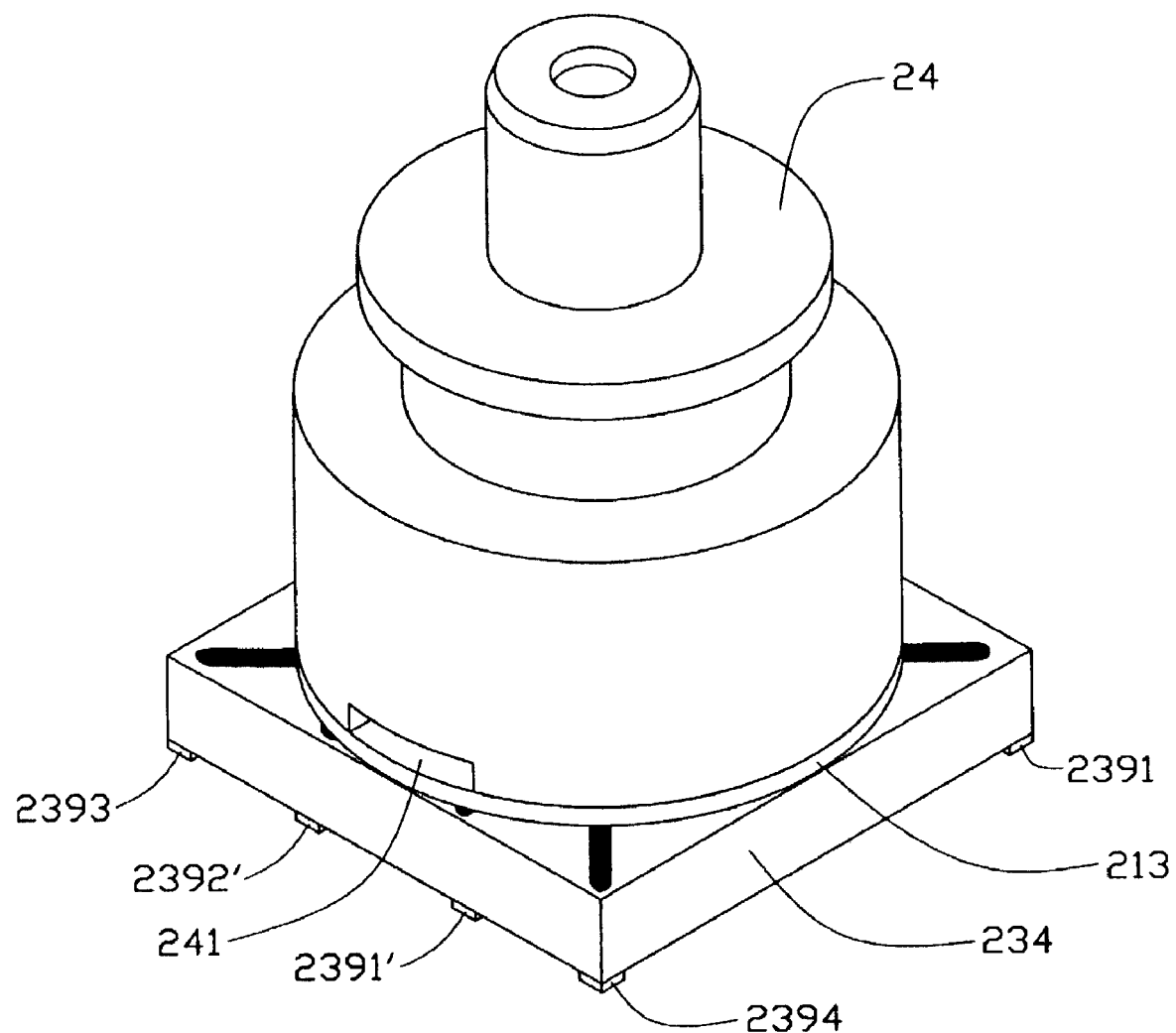
FIG. 1 is a perspective view of an optical package structure of a preferred embodiment of the present invention.
Figure 2:
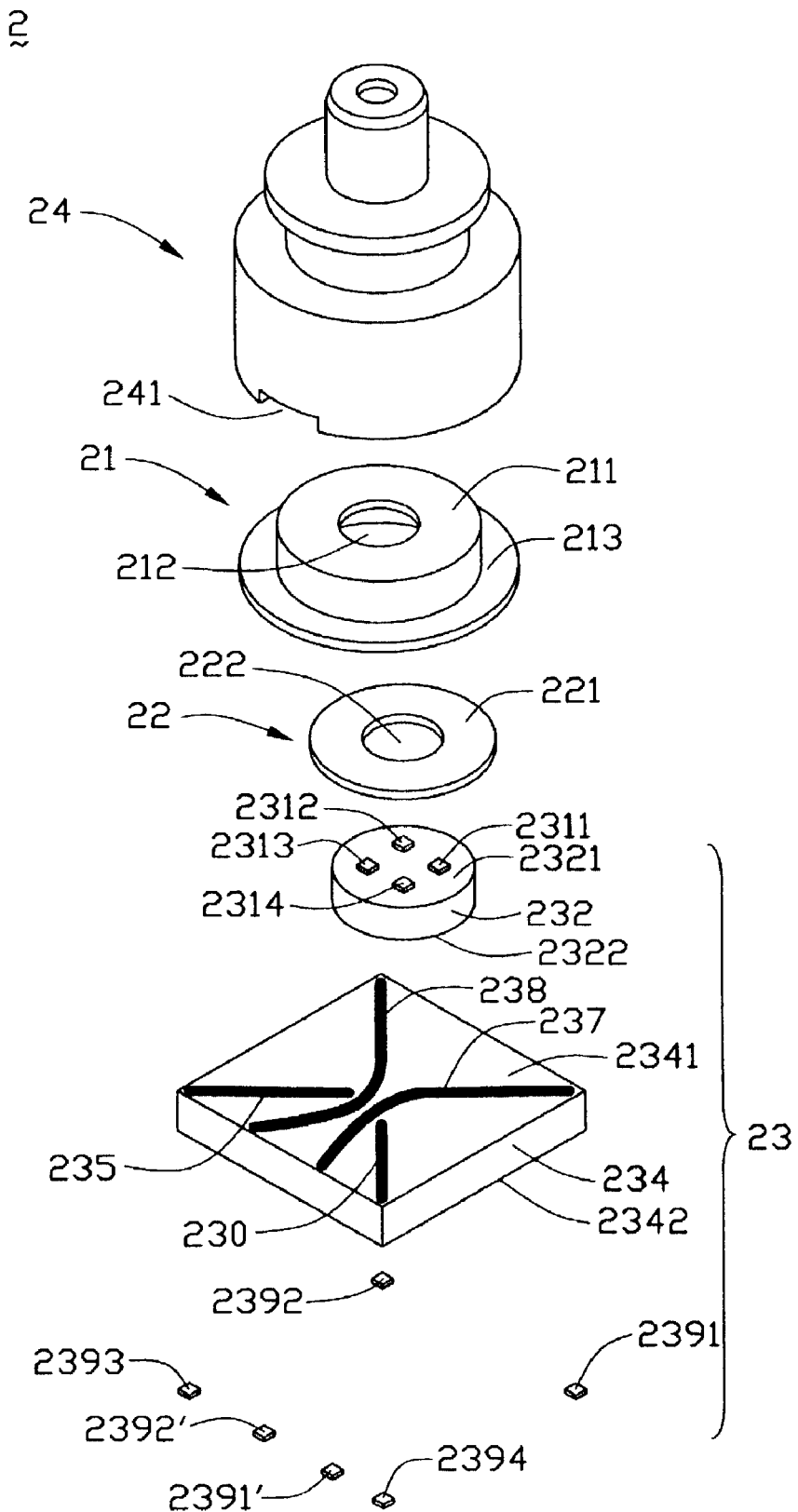
FIG. 2 is an exploded perspective view of the optical package structure of FIG. 1.

Referring now to the drawings in detail, FIGS. 1 and 2 show an optical package structure 2 in accordance with a preferred embodiment of the present invention. The optical package structure 2 comprises a cover 21, a lens part 22 and a base member 23. The lens part 22 is generally secured to the cover 21, and then the cover 21 combines with the base member 23 to define a closed space in which to receive and protect optical components (not shown). The optical package structure 2 further includes an engaging part 24 which surrounds the cover 21 for engaging with an optical fiber or other optical components. The engaging part 24 also has an opening 241 to make the assembly and disassembly of the engaging part 24 with and from the cover 21 easier.

The cover 21 is cap-shaped, and is generally made of metal or other conductive materials. The cover 21 has a top panel 211 and a bottom edge 213. The top panel 211 has an aperture 212 in the middle adapted for transmission of optical signals. An upper surface of the bottom edge 213 firmly engages with the engaging part 24, and a lower surface engages with the base member 23. The lower surface is covered by a layer of insulative material as known in the art. The lens part 22 comprises a lens 222, and a mounting frame 221 to receive the lens 222 therein. When the lens part 22 is secured to the cover 21, the lens 222 optically aligns with the aperture 212 of the cover 21.

Figure 3:
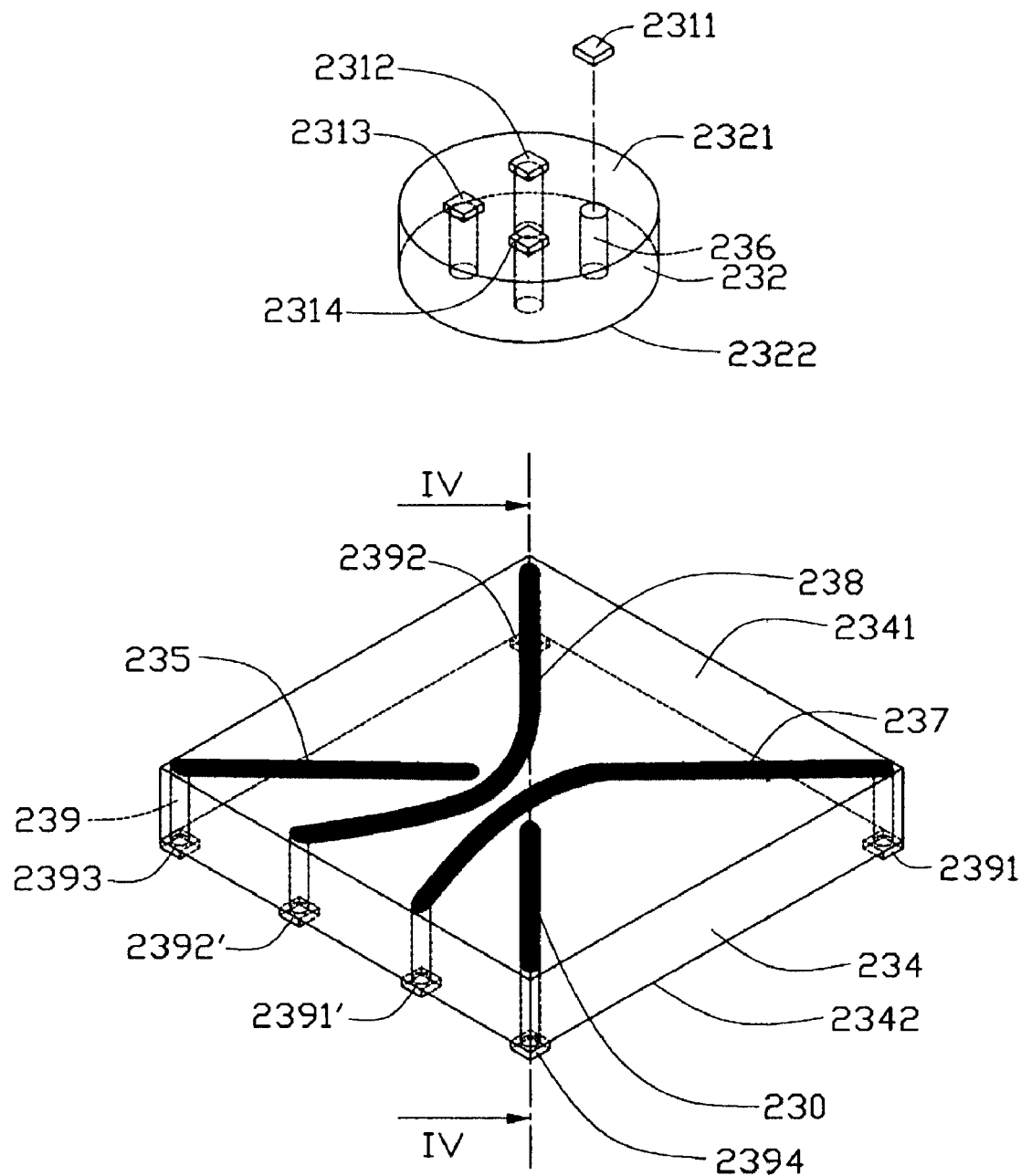
FIG. 3 is an exploded perspective view of a base member of the optical package structure of FIG. 1.
Figure 4:
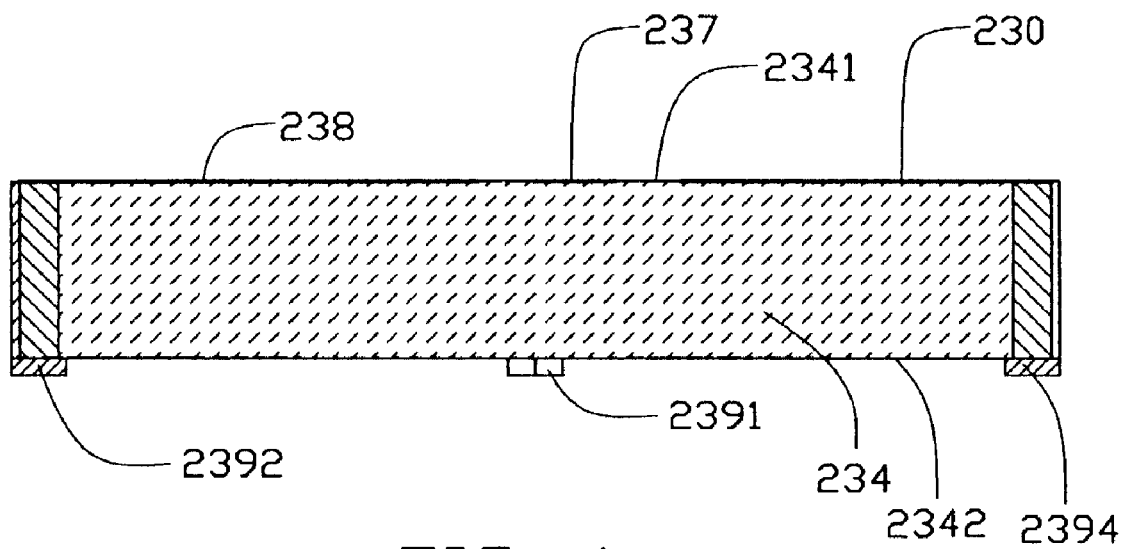
FIG. 4 is a cross-sectional view taken along line IV—IV of FIG. 3.

Now referring to FIGS. 3–4, the base member 23 is formed from a kind of ceramic manufactured using Low-Temperature Co-Fired Ceramic (LTCC) technology. In this technology, predetermined circuits or components are formed of a kind of conductive material on a plurality of ceramic sheets, then the ceramic sheets are pressed together and fired at a low temperature to integrally combine them. In the present invention, the conductive material may be copper, aluminum, gold or silver, and the ceramic material may be aluminum nitride.

The base member 23 includes a bottom panel 232 and a substrate 234. The bottom panel 232 has a first surface 2321 for mounting optical components (not shown) thereon, a second surface 2322, and a plurality of inner conductive traces 236 extending through the bottom panel 232. A plurality of solder pads 2311, 2312, 2313, 2314 is provided on the first surface 2321 to electrically connect with the optical components (not shown) and the conductive traces 236. The substrate 234 has a top surface 2341 with printed circuits 237, 238, 235, 230 thereon, a bottom surface 2342 with a plurality of solder pads 2391, 2392, 2393, 2394 thereon, and a plurality of inner conductive traces 239 extending through the substrate 234 and electrically connecting the printed circuits 237, 238, 235, 230 with the solder pads 2391, 2392, 2393, 2394, respectively. Two extra solder pads 2391' and 2392' arranged on the same side with the solder pads 2393, 2394 are electrically connected with the solder pads 2391, 2392 by inner conductive traces 239 and printed circuits 237, 238. When the bottom panel 232 is assembled to the substrate 234, the second surface 2322 of the bottom panel 232 is coupled to the top surface 2341 of the substrate 234. Correspondingly, the conductive traces 236 electrically connect with the printed circuits 237, 238, 235, 230 respectively, so the solder pads 2311, 2312, 2313, 2314 electrically connect with the solder pads 2391, 2392, 2393, 2394, respectively.

During assembly of the optical package structure 2, the optical components are first mounted on the base member 23 and are electrically connected to the solder pads 2311, 2312, 2313, 2314. The lens part 22 is then secured to the cover 21 and the cover 21 is fixed to the base member 23, to package the optical components between the cover 21 and base member 23.

Because the solder pads 2311, 2312, 2313, 2314 electrically connect with the optical components (not shown), for example, laser emitting devices, and to corresponding solder pads 2391, 2392, 2393, 2394, an external electrical connection of the laser emitting devices is thus attained at the solder pads 2391, 2392, 2391', 2392', 2393, and 2394.

Because the optical package structure of the present invention uses inner trace connection through the conductive traces 236, the printed circuits 230, 235, 237, 238 and the conductive traces 239 instead of wire and pin connections, the capacitance and inductance effects associated with long wires and electrical pins in high frequency transmissions are avoided, which can significantly improve performance and reliability. In addition, omitting the electrical pins and wires allows smaller packaging volumes and higher-density packaging. Furthermore, short circuits are avoided because the electrical pins and wires are eliminated.

Figure 5:
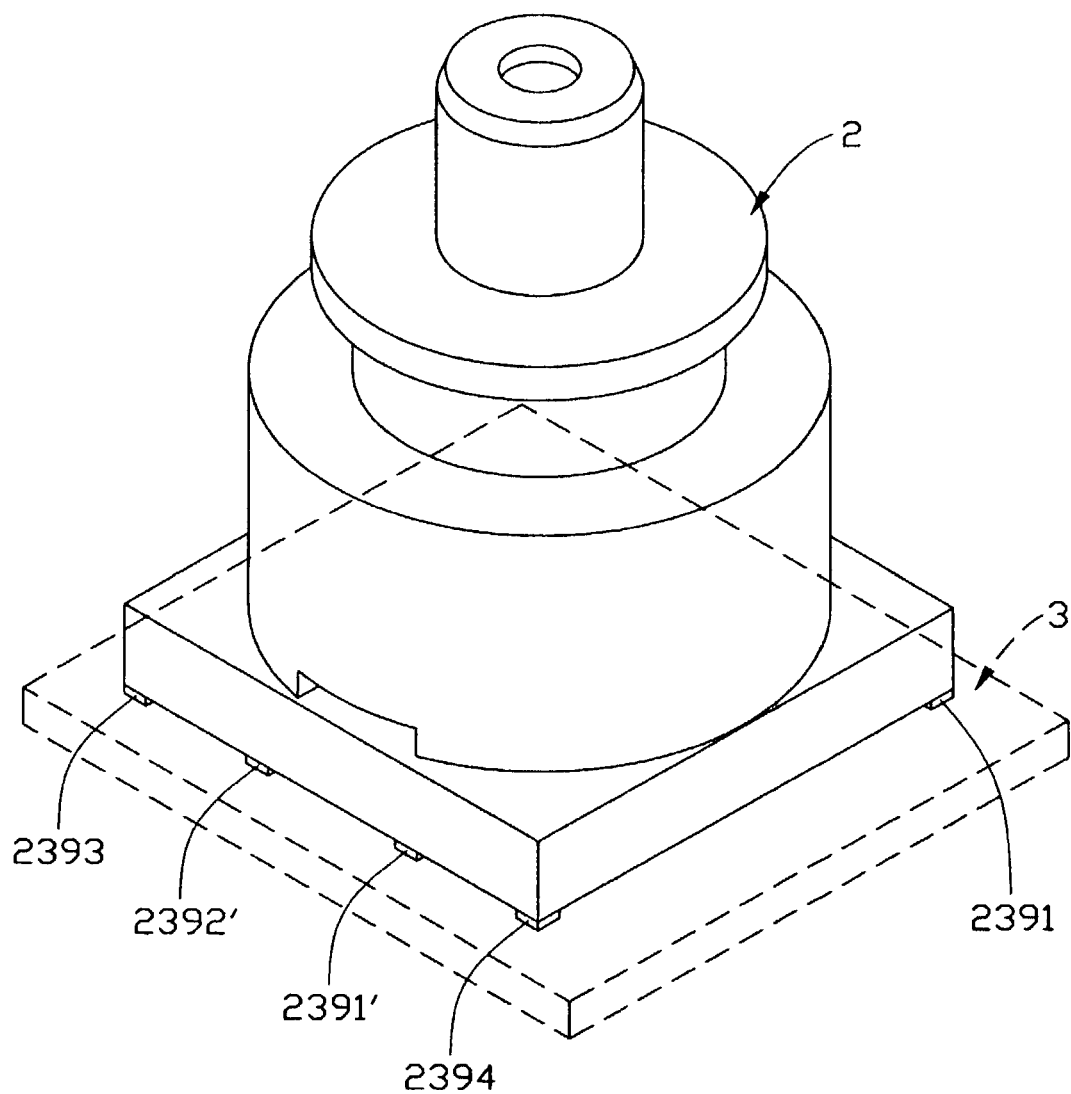
FIG. 5 is a perspective view of the optical package structure of FIG. 1 assembled with a printed circuit board (PCB), with a vertical axis perpendicular to the PCB plane.

Referring to FIG. 5, the optical package structure 2 is shown assembled to a PCB 3 in a flat configuration. The vertical axis of the optical package structure 2 is perpendicular to the plane of the PCB 3. All six of the solder pads 2391, 2392, 2393, 2394, 2391', and 2392' can be electrically connected with electrical circuitry (not shown) on the PCB 3, although only four (2393, 2394, and 2391 or 2391', and 2392 or 2392') are required for complete electrical connection. Thus, electrical connection of the optical components to the PCB 3 is completed.

Figure 6:
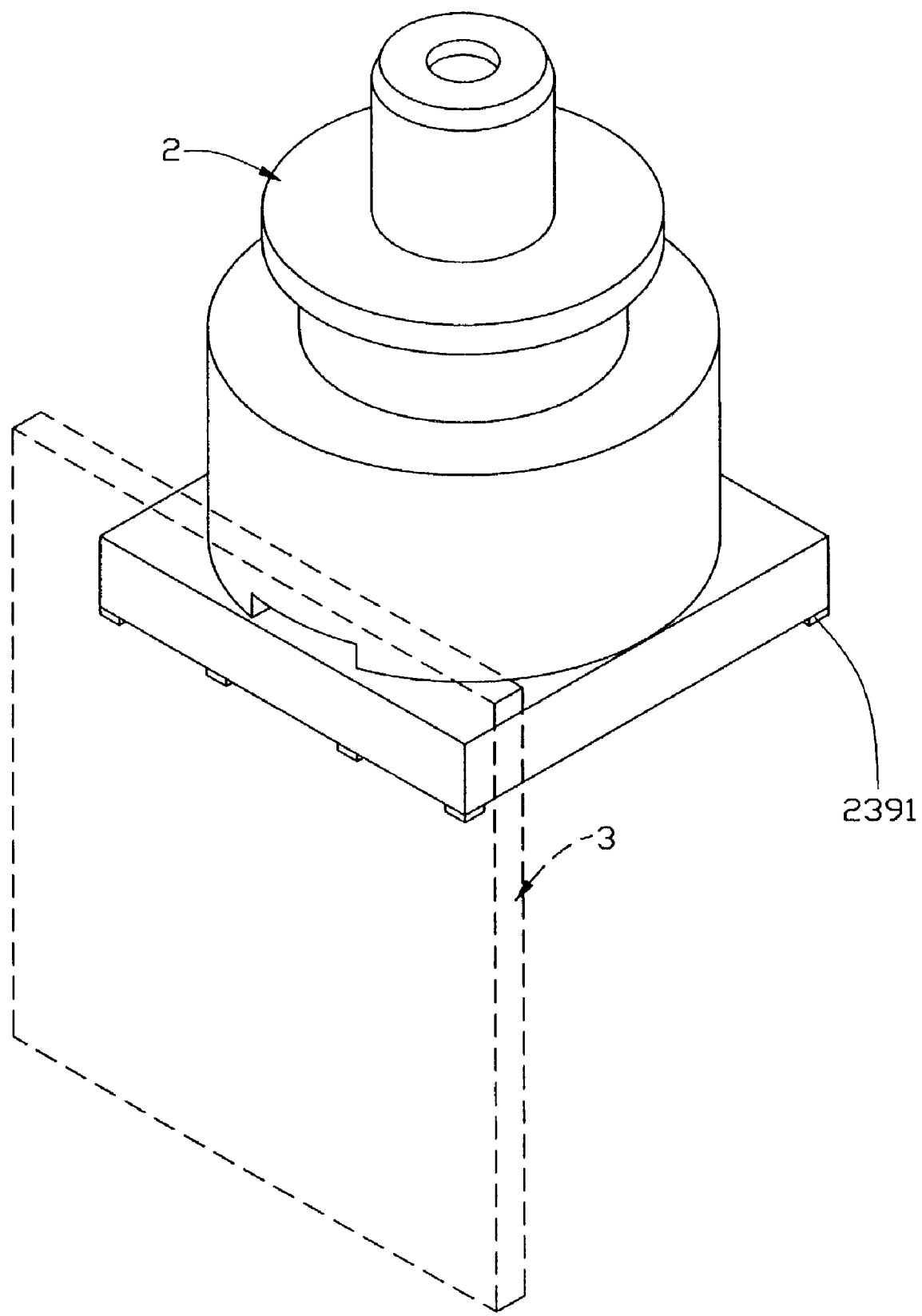
FIG. 6 is a perspective view of the optical package structure of FIG. 1 assembled with a PCB, with the vertical axis of the optical package structure parallel with the PCB plane.
Figure 7:
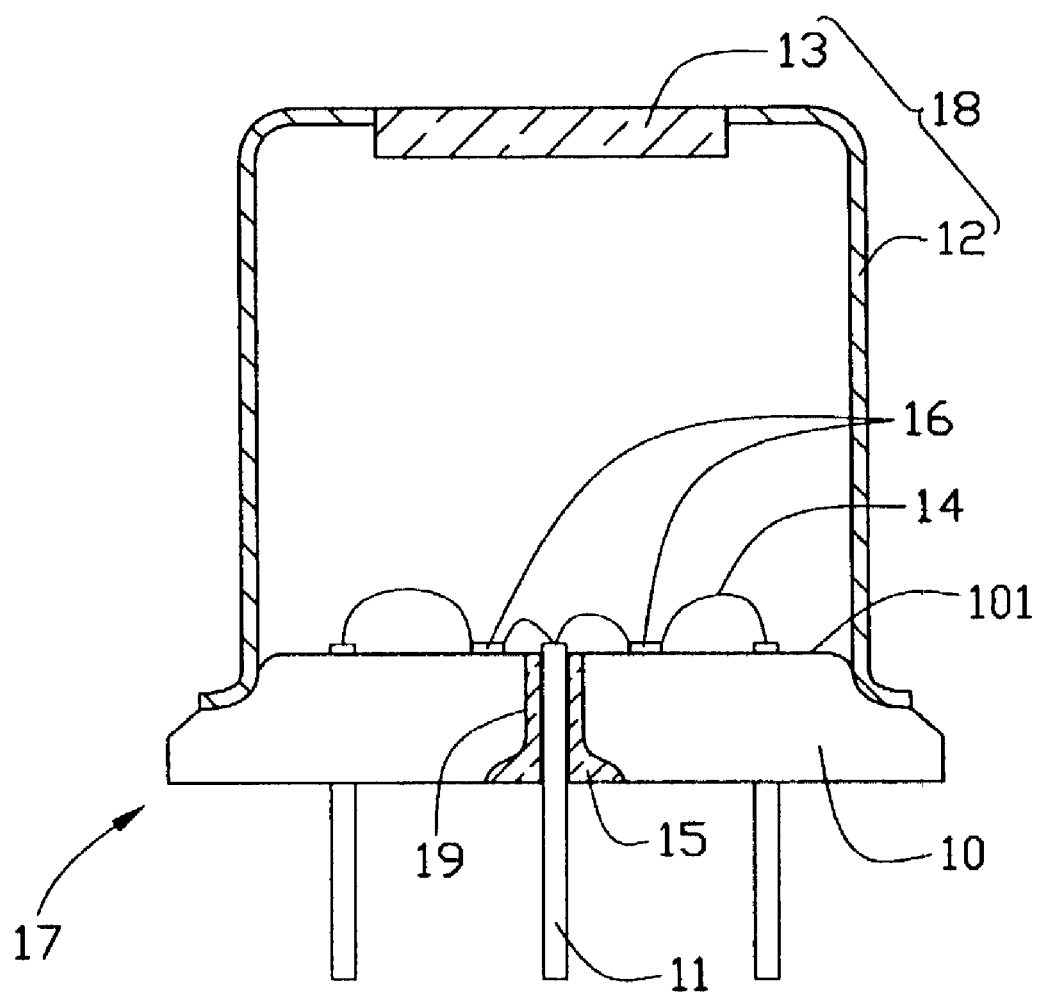
FIG. 7 is a schematic cross-sectional view of an optical package structure of the prior art.

Referring to FIG. 6, the optical package structure 2 is shown assembled to the PCB 3 in an edge configuration. The vertical axis of the optical package structure 2 is parallel to the plane of the PCB 3. The four solder pads 2391', 2392', 2393, 2394 on one side of the bottom surface 2342 of the substrate 234 are electrically connected with the electrical circuitry (not shown) on the PCB 3. In this configuration, the optical package structure 2 takes up less space on the PCB 3, and there is more room on the PGB 3 for other optical or electronic components.

It is understood that the invention may be embodied in other forms without departing from the spirit thereof. Thus, the present embodiment with four solder pads on the bottom panel 232 and six solder pads on the substrate 234 is illustrative of the general case. As many solder pads as required by the optical components attached and the circuitry of the PCB 3 is intended, and the invention is not to be limited to the details given herein.

We claim:

1. An optical package structure for mounting to a printed circuit board (PCB), comprising:
   a cover with a lens part in a top portion thereof; and
   a base member combining with the cover to define a closed space in which to package optical components;
   wherein a plurality of solder pads is provided on a top surface and a bottom surface of the base member, and a plurality of inner conductive traces extends through the base member and electrically connects the solder pads on the top surface to the solder pads on the bottom surface, and all the solder pads on the top surface are electrically connected to a complementary solder pad located along a first side edge of the bottom surface, and at least one solder pad on the top surface is connected also to a complementary solder pad on the bottom surface at a place other than along the first side edge, thereby allowing the optical package structure to be mounted on the PCB in two configurations: 1) wherein the bottom surface of the base member is parallel to a face of the PCB, and any of the solder pads on the bottom surface connect to the PCB; and 2) wherein the bottom surface is perpendicular to the face of the PCB, and the solder pads along the first side edge connect to the PCB.

2. The optical package structure as claimed in claim 1, wherein the cover comprises a lower surface covered by a layer of insulative material.

3. The optical package structure as claimed in claim 1, wherein a plurality of optical components are fitted in the optical package structure and are connected to corresponding solder pads on the top surface.

4. The optical package structure as claimed in claim 3, wherein the base member includes a bottom panel and a substrate.

5. The optical package structure as claimed in claim 4, wherein the bottom panel has a first surface, a second surface, and a plurality of inner conductive traces extending through the bottom panel, and a plurality of the solder pads is provided on the first surface to electrically connect with the conductive traces.

6. The optical package structure as claimed in claim 5, wherein the substrate has a top surface with printed circuits thereon, a bottom surface with a plurality of the solder pads thereon, and a plurality of inner conductive traces extending through the substrate to electrically connect the printed circuits with the solder pads.

* * * * *